United States Patent [19]

Haller et al.

[11] Patent Number: 5,110,679

[45] Date of Patent: May 5, 1992

[54] HARD CARBON NITRIDE AND METHOD FOR PREPARING SAME

[75] Inventors: Eugene E. Haller; Marvin L. Cohen, both of Berkeley; William L. Hansen, Walnut Creek, all of Calif.

[73] Assignee: The Regents of the University of California, Berkeley, Calif.

[21] Appl. No.: 513,245

[22] Filed: Apr. 24, 1990

[51] Int. Cl.$^5$ .......................... B32B 9/00; B32B 9/04; C23C 14/06

[52] U.S. Cl. .............................. 428/408; 204/192.15; 204/192.16; 204/192.22; 423/384; 428/446; 428/469; 428/698; 428/699; 428/700; 428/704

[58] Field of Search ............... 428/408, 698, 446, 699, 428/700, 704, 469; 423/364, 384; 204/192.15, 192.16, 192.22

[56] References Cited

U.S. PATENT DOCUMENTS

| | | | |
|---|---|---|---|
| 1,123,584 | 1/1915 | Peacock | 423/364 |
| 4,774,130 | 9/1988 | Endo et al. | 204/192.16 |

FOREIGN PATENT DOCUMENTS

| | | | |
|---|---|---|---|
| 0155178 | 9/1985 | European Pat. Off. | 204/192.16 |
| 210267 | 8/1988 | Japan | 204/192.15 |
| 210268 | 8/1988 | Japan | 204/192.15 |

Primary Examiner—Wayne Langel
Attorney, Agent, or Firm—Flehr, Hohbach, Test, Albritton and Herbert

[57] ABSTRACT

Novel crystalline $\alpha$ (silicon nitride-like)-carbon nitride and $\beta$ (silicon nitride-like)-carbon nitride are formed by sputtering carbon in the presence of a nitrogen atmosphere onto a single crystal germanium or silicon, respectively, substrate.

36 Claims, 1 Drawing Sheet

HARD CARBON NITRIDE AND METHOD FOR PREPARING SAME

STATEMENT AS TO RIGHTS TO INVENTION MADE UNDER FEDERALLY-SPONSORED RESEARCH AND DEVELOPMENT

The work resulting in this invention was supported by the Director, Office of Energy Research, Office of Basic Energy Sciences, Materials Science Division, of the U.S. Department of Energy under Contract No. DE-AC03-76SF00098. The federal government may have rights in this matter.

The present invention is directed to a novel hard crystalline carbon nitride and method for preparing same.

BACKGROUND OF THE INVENTION

As used herein, the terms $\alpha$ and $\beta$ when used to identify carbon nitride crystalline phases shall refer to the crystalline structures of $\alpha$ and $\beta$ respectively, of silicon nitride ($\alpha$-$Si_3N_4$ and $\beta$-$Si_3N_4$), both of which have known crystal structures. Since $\alpha$ and $\beta$ carbon nitride, hereinafter sometimes referred to as $\alpha$-$C_3N_4$ and $\beta$-$C_3N_4$ have not heretofore been made, the $\alpha$ and $\beta$ terms would otherwise have no meaning unless referred to known crystal structures. High bulk moduli were predicted for covalently bonded carbon-nitrogen materials on a theoretical basis by Cohen, M. L., *Phys. Rev.* B32, 7988 (1985). However, heretofore, it is not believed that anyone has successfully made any $\beta$-carbon nitride phase nor any $\alpha$-carbon nitride phase. Silicon nitride itself is of considerable interest for use in high performance engineering materials because of its strength and hardness, high decomposition temperature and excellent resistance to corrosion and wear. For example, silicon nitride may be used as a high temperature structural material in engine components and cutting tools. Since it has a low mass density, and it may be made into light weight, low inertia components which have excellent strength-to-weight ratios. For those same reasons, carbon nitride, which theoretically was predicted to have a large bulk modules by Liu, A. Y. and Cohen, M. L. *Science* 245, 841 (1989); carbon nitride is even more desirable for such uses.

It is therefore an object of the present invention to provide two new crystalline carbon nitride compounds, hereafter referred to as $\alpha$-carbon nitride and $\beta$-carbon nitride, wherein the $\alpha$ and $\beta$ refer to the known $\alpha$ and $\beta$ crystalline structures of silicon nitride.

It is further an object of the present invention to provide methods for preparing such $\alpha$ and $\beta$ carbon nitrides.

These and other objects will be apparent from the following description from the appended claims.

SUMMARY OF THE INVENTION

The present invention provides novel at least partially $sp^3$-bonded crystalline carbon nitrides and methods of preparation thereof. While polymeric ($sp^2$-bonded) carbon nitrides are known, crystalline at least partially $sp^3$-bonded carbon nitride has heretofore not been synthesized.

The present invention particular provides novel crystalline $\alpha$ and $\beta$-phase carbon nitride. The present invention further provides a method for making crystalline $\alpha$ and $\beta$-carbon nitride by sputtering from a carbonaceous target in the presence of a nitrogen atmosphere onto a single crystal silicon or germanium substrate.

Figure 1:
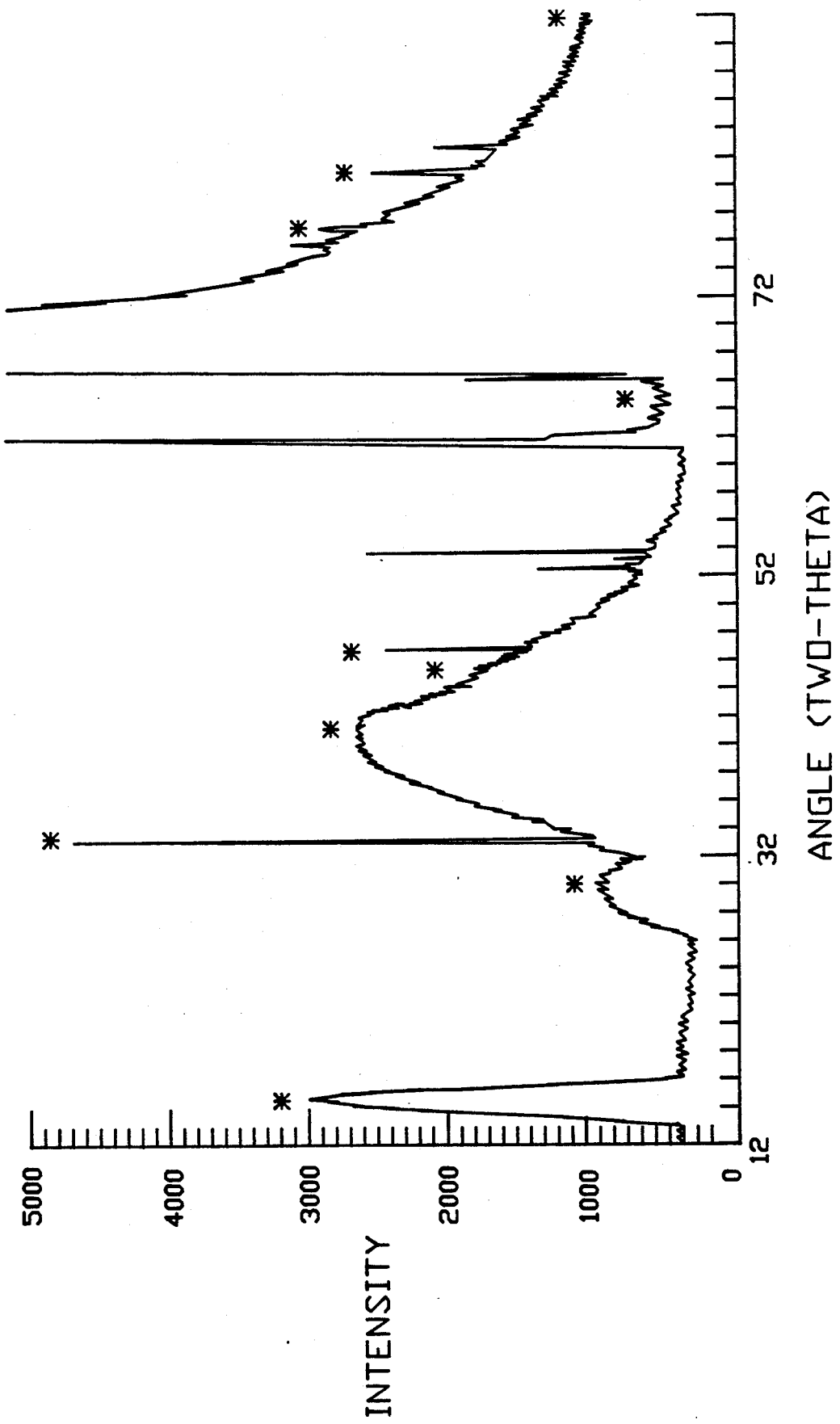
FIG. 1 shows the X-ray diffraction pattern from the sample film CN#23 deposited on a Si(100) substrate.

Preferably, thin films containing carbon and nitrogen (C—N films) will be deposited on oriented single crystal Si or Ge wafers using the RF diode sputtering technique. Frequencies in the MHz range, and preferably about 13.56 MHz, are useful. The target is carbonaceous, preferably graphite. To obtain the data in the tables, an 8 inch graphite disc situated 6 cm above the substrate was used. Sputtering was carried out with RF power of 300 W, although 50 to 1000 W may be used, with essentially pure $N_2$ at a pressure in the range of 5 to 50 mTorr, preferably 17 mTorr. A substrate temperature during sputtering is preferably maintained between about 400° and 600° C. If graphite is the target, its self bias may be about 1700 V.

The composition and thickness of a particular C—N film (identified as CN#23 in the Tables) was made using the aforementioned preferred conditions deposited on several substrates simultaneously including (100) and (111) Si as well as (100) and (111) Ge wafers, and were studied by Rutherford backscattering spectrometry (RBS) using a 2.0 MeV $^4He^+$ beam and proton resonant scattering (PRS) using a 1.55 MeV $H^+$ beam. Details of the apparatus and the techniques have been published by Yu et al., *Nucl. Instrum. Method* B30, 551 (1988), incorporated herein by reference. RBS and PRS showed that the sample CN#23 was about 1 $\mu m$ thick with a nominal film composition of $C_{1.5}N_{1.0}$ with about 12 atomic percent of O. RBS analysis also revealed that the film/substrate interface was abrupt without apparent interdiffusion between the film and the Si substrate within the depth resolution of the technique (about 200 Å).

X-ray diffraction (XRD) measurements were carried out in a Siemens D500 X-ray diffractometer using a Cu anode. Diffraction occurred in the conventional Bragg-Brentanno geometry. XRD analyses of the sample CN#23 film deposited under the conditions used on the (100) Ge and (111) Si wafers show no diffraction peaks to indicate crystalline phases. However, XRD from CN#23 on (111) Ge showed at small sections close to the edge of the wafer. In these particular sections, XRD reveals a pattern matching the $\alpha$-$C_3N_4$ phase. Table I is a summary of the XRD pattern from one of the sections together with the calculated $\alpha$-$C_3N_4$ pattern. Although the $\alpha$ and $\beta$ structures have similar local atomic coordination, a difference in stacking sequences results in the $\alpha$ primitive cell being twice as large as the $\beta$ cell. The theoretical X-ray patterns listed in Table I are calculated using the experimentally determined internal coordinates of $\alpha$-$Si_3N_4$, with the lattice parameters scaled down by the ratio of the calculated $\beta$-$C_3N_4$ to the measured $\beta$-$Si_3N_4$ lattice constants. The diffraction patterns are derived from the superposition of atomic core and valence electron charge densities in the crystalline structure. The intensities are calculated under the assumption of a continuous distribution of crystal orientation, such as in powder samples.

TABLE I

Comparison of XRD data of CN#23 on Ge (111) with the calculated $\alpha$-C$_3$N$_4$ powder diffraction pattern.

| XRD | | Calculated $\alpha$-C$_3$N$_4$ pattern | | | |
|---|---|---|---|---|---|
| d (Å) | Intensity[a] | d (Å) | hkl | Intensity | |
| | | 5.664 | 100 | w | |
| 3.624 (±0.042) | w | 3.635 | 101 | s | |
| 3.528 (±0.042) | w | | | | |
| 3.285 (±0.036) | vs | 3.270 | 110 | m | Ge (111) |
| | | 2.832 | 200 | m | |
| 2.555 (±0.021) | vw | | | | |
| 2.411 (±0.018) | m | 2.431 | 201 | s | |
| 2.331 (±0.018) | vw | 2.370 | 002 | w | |
| 2.194 (±0.015) | s | 2.186 | 102 | m | |
| | | 2.141 | 210 | s | |
| 1.931 (±0.012) | w | 1.951 | 211 | w | |
| | | 1.919 | 112 | s | |
| | | 1.888 | 300 | s | |
| 1.803 (±0.009) | w | | | | |
| | | 1.754 | 301 | w | |
| 1.631 (±0.009) | vs | | | | Ge (222) |
| | | 1.589 | 212 | w | |
| | | 1.571 | 310 | w | |
| | | 1.522 | 103 | w | |
| | | 1.491 | 311 | w | |
| 1.346 (±0.006) | w | 1.346 | 222 | m | |
| 1.309 (±0.006) | w | 1.309 | 312 | vw | |
| | | 1.271 | 213 | w | |
| | | 1.253 | 321 | m | |
| 1.205 (±0.003) | vs | 1.212 | 303 | w | |
| | | 1.196 | 411 | w | |
| | | 1.185 | 004 | w | |
| 1.136 (±0.003) | w | 1.139 | 322 | m | |

[a]vs, s, m, w, and vw represent very strong, strong, medium, weak, and very weak diffraction intensities.

Referring to FIG. 1 there shows the XRD pattern of the sample film CN#23 on Si (100). This pattern is typical for all films deposited on (100) Si substrates under similar deposition conditions. The broad peak centered around 2Θ=40° is believed to be due to an amorphous C—N phases in the film. The sharp diffraction peaks are tabulated in Table II together with the electron diffraction data obtained from the same film and the calculated $\beta$-C$_3$N$_4$ pattern. From Table II it can be seen that most of the major peaks in the calculated $\beta$-C$_3$N$_4$ pattern are slightly shifted to a higher 2Θ position. This indicates that the $\beta$-C$_3$N$_4$ crystal lattice parameters of the crystals in the film, must be slightly smaller than the calculated values from a minimization of the zero-temperature total crystal energies with respect to volume ($a_o$=6.4 Å and $c_o/a_o$=0.3826). Using the strong (200) and (111) peaks in the XRD pattern, the lattice parameters of the $\beta$-C$_3$N$_4$ phase are calculated to be $a_o$=6.26 Å and $c_o$=2.398 Å. While these values are about 2% lower than the results from the total energy calculations, the experimental and theoretical $c_o/a_o$ ratios are in excellent agreement. The powder diffraction pattern using the new shorter lattice parameters are calculated and presented in Table II in parenthesis alongside with the theoretical pattern. A close match of the peak positions of the XRD pattern with this new calculated pattern is observed.

TABLE II

Comparison of XRD and TED data of CN#23 on Si (100) with the calculated $\beta$-C$_3$N$_4$ powder diffraction pattern.

| TED | | XRD | | Calculated $\beta$-C$_3$N$_4$ pattern | | |
|---|---|---|---|---|---|---|
| d (Å) | Intensity[a] | d (Å) | Intensity | d (Å) | hkl | Intensity |
| | | 6.017 (±0.039) | s | | | |
| | | | | 5.540 (5.420) | 100 | m |
| 3.43 (±0.05) | w | | | | | |
| 3.15 (±0.05) | w | 3.124 (±0.033) | w | 3.200 (3.130) | 110 | m |
| 2.65 (±0.03) | vw | 2.706 (±0.024) | s | 2.770 (2.710) | 200 | s |
| 2.18 (±0.02) | s | 2.205 (±0.021) | vw | 2.240 (2.193) | 101 | s |
| 2.07 (±0.02) | m | 2.050 (±0.015) | m | 2.095 (2.050) | 210 | m |
| 1.92 (±0.02) | w | 1.905 (±0.009) | m | 1.945 (1.904) | 111 | m |
| | | | | 1.850 (1.807) | 300 | m |
| 1.76 (±0.01) | w | | | | | |
| | | 1.680 (±0.009) | m | | | |
| | | 1.657 (±0.009) | m | | | |
| 1.64 (±0.01) | w | 1.631 (±0.009) | m | | | |
| | | 1.609 (±0.009) | vw | | | |
| | | | | 1.592 (1.558) | 211 | w |
| | | 1.510 (±0.006) | vs | 1.537 (1.504) | 310 | w |
| | | 1.417 (±0.006) | m | 1.475 (1.443) | 301 | w |
| 1.38 (±0.01) | vw | 1.399 (±0.006) | m | | | |
| | | | | 1.340 (1.311) | 221 | w |
| | | 1.263 (±0.003) | w | | | |
| 1.25 (±0.01) | s | 1.247 (±0.003) | m | 1.272 (1.224) | 320 | w |
| 1.18 (±0.01) | vw | 1.190 (±0.003) | m | 1.225 (1.199) | 002 | w |
| | | 1.170 (±0.003) | w | | | |
| 1.16 (±0.01) | w | 1.158 (±0.003) | w | 1.130 (1.104) | 321 | m |
| 1.11 (±0.01) | w | 1.095 (±0.003) | w | 1.120 (1.097) | 202 | w |
| 1.07 (±0.01) | m | | | 1.080 (1.061) | 411 | w |

[a]vs, s, m, w, and vw represent very strong, strong, medium, weak, and very weak diffraction intensities.

In Table II several expected peaks are missing in the XRD pattern which are predicted from the calculated $\beta$-C$_3$N$_4$ pattern. They are foremost the (100), (300) and (221) peaks. However, the absence of specific diffraction peaks is a commonly observed phenomenon, whenever the substrate crystal orientation affects the growth of a overlayer, and simply means that a degree of texturing has probably taken place. In addition to the peaks attributed to the $\beta$-C$_3$N$_4$ phase, the XRD pattern also shows further small diffraction peaks indicating the presence of a small quantity of additional phases in this C—N film. The anomalously intense peak at 2Θ=61.7° (d=1.51 Å) is believed to arise from the substrate Si (320) diffraction which is forbidden in a normal diamond cube lattice. XRD from sample CN#23 on Ge (100) wafer also shows an intense peak at 2Θ=59.7° (d=1.56 Å) which also corresponds to the forbidden (320) Ge diffraction. The presence of such intense (320) forbidden diffraction peaks may be explained by dynamical diffraction effects or stress at the interface created by the C—N films.

Transmission electron microscopy (TEM) investigations of the C—N films were performed using a Philips 301 electron X microscope at an operating voltage of 100 kV. The specimens are prepared by both chemical etching and ion milling techniques. From the transmission electron diffraction (TED) pattern corresponding to a TEM dark field (DF) image of a plane-view specimen from CN#23 on Si (100), the ring pattern indicates that the grains are polycrystalline. The lattice spacings are measured directly from the TED pattern and are tabulated in Table II. Of all the diffraction rings, only a few rings with weak intensities do not match with the theoretical $\beta$-$C_3N_4$ pattern. From the excellent agreement of the d-spacings obtained from TED and XRD analyses and from theory, this film on Si (100) is the first production of the $\beta$-$C_3N_4$ phase, heretofore only theoretically predicted. The $\beta$-$C_3N_4$ grains as shown in the DF image are about 0.5 $\mu$m in diameter. These grains are distributed near the film/substrate interface embedded in the C—N polymeric matrix. These $\beta$-$C_3N_4$ grains are estimated to occupy less than 5% of the film volume. This is consistent with the RBS and the PRS results which show a C-rich film.

The XRD pattern in Table II also shows several peaks which cannot be attributed to the calculated $\beta$-$C_3N_4$ phase and are not present in the TED pattern. Since the X-ray beam used covered only a 2 mm $\times$ 8 mm sample area and the $\beta$-$C_3N_4$ crystals only occupy about 5% of the film volume, it would not be expected that other crystalline phases in the film also contribute to the XRD pattern. These additional XRD peaks can be interpreted with polysilicon and several known graphite phases. In the case of TED, the electron beam can be focused onto the crystals of interest resulting in a much cleaner diffraction pattern corresponding to only the $\beta$-$C_3N_4$.

Where the preferred embodiments have been described above, it will also be apparent to those of ordinary skill in the art that various modifications may be made to the above teachings and from practice of the invention. Such changes include changing the gas pressure and composition to modify the nitrogen radical density, for example, using nitrogen compounds, N and C containing gases, adding hydrogen or helium. The deposition conditions can be further modified using D.C. or R.F. substrate biasing and the target can be replaced by a virtual target from a magnetically confined carbon-nitrogen containing plasma (for example, cyanogen ($C_2N_2$) and nitrogen). Furthermore, while it is realized that under the conditions given in the preferred embodiment, that if particular conditions resulted in the deposition of $\beta$-carbon nitride upon a single crystal silicon substrate having a crystal surface orientation of (100), and that under the particular conditions used crystalline $\alpha$-carbon nitride deposited upon the germanium substrate having a crystalline surface orientation (111), it should be apparent that other types of substrates having appropriate lattice parameters and orientation, such as sapphire or oxides of Ti, etc., may now be readily determined and the conditions used for depositing the $\alpha$ and/or $\beta$ carbon nitrides thereover given the teachings of the present invention and practice thereof. The present invention is not deemed to be limited in any way by the foregoing description and is defined by the following claims.

What is claimed is:

1. A method of preparing at least partially $sp^3$-bonded crystalline carbon nitride comprising the step of depositing carbon and nitrogen radicals upon a crystalline substrate having appropriate lattice parameters and orientation for formation thereon of said $sp^3$-bonded crystalline carbon nitride.

2. A method according to claim 1 wherein said $sp^3$-bonded crystalline carbon nitride comprises crystalline $\beta$-$C_3N_4$ and/or $\alpha$-$C_3N_4$, comprising the step of applying a source of energy to a carbonaceous target, in the presence of a nitrogen atmosphere, said energy being sufficient to sputter at least a portion of said target onto a substrate to form a crystalline $\alpha$- and/or $\beta$-$C_3N_4$ phase upon said substrate, wherein said substrate comprises an oriented single crystal of silicon, germanium, or other crystalline substrate having appropriate lattice parameters and orientation.

3. A method according to claim 2, wherein said substrate comprises single crystal silicon.

4. A method according to claim 3, wherein said single crystal silicon is has a surface of (100) orientation and $\beta$-$C_3N_4$ is formed thereon.

5. A method according to claim 3 or 4, wherein said target comprises carbon.

6. A method according to claim 5, wherein said source of energy comprises energy generated by an RF diode.

7. A method according to claim 5, wherein said atmosphere consists essentially of nitrogen.

8. A method according to claim 1 wherein said carbon and nitrogen radicals are formed in a plasma consisting essentially of cyanogen and nitrogen.

9. A method according to claim 2, wherein said substrate comprises a single crystal germanium.

10. A method according to claim 9, wherein said single crystal germanium has a surface of (111) orientation and $\alpha$-$C_3N_4$ is formed thereon.

11. A method according to claim 9 or 10, wherein said target comprises carbon.

12. A method according to claim 11, wherein said source of energy comprises energy generated by an RF diode.

13. A method according to claim 12, wherein said atmosphere consists essentially of nitrogen.

14. Crystalline $sp^3$-bonded carbon nitride.

15. Crystalline $\beta$-phase carbon nitride.

16. Crystalline $\beta$-phase carbon nitride according to claim 15 having the empirical formula $C_3N_4$.

17. A composite comprising crystalline $\beta$-phase carbon nitride on a single crystal silicon substrate.

18. A composite according to claim 17, wherein said $\beta$-phase carbon nitride has the formula $C_3N_4$.

19. A composite according to claim 17 or 18, wherein said single crystal silicon has a surface of (100) orientation.

20. Crystalline $\alpha$-phase carbon nitride.

21. Crystalline $\alpha$-phase carbon nitride according to claim 20 having the empirical formula $C_3N_4$.

22. A composite comprising crystalline $\alpha$-phase carbon nitride on a single crystal germanium substrate.

23. A composite according to claim 22, wherein said $\alpha$-phase carbon nitride has the empirical formula $C_3N_4$.

24. A composite according to claims 22 or 23, wherein said germanium has a surface of (111) orientation.

25. A product comprising $\alpha$-phase carbon nitride made according to claim 9 or 10.

26. A product comprising α-phase carbon nitride made according to the process of claim 11.

27. A product comprising α-phase carbon nitride made according to the process of claim 12.

28. A product comprising α-phase carbon nitride made according to the process of claim 13.

29. A composition of matter comprising β-phase carbon nitride made by a method comprising the step of depositing carbon and nitrogen radicals upon a crystalline substrate having appropriate lattice parameters and orientation for formation thereon of at least partially sp$^3$-bonded crystalline carbon nitride.

30. A composition of matter comprising β-phase carbon nitride made by a method comprising the step of applying a source of energy to a carbonaceous target in the presence of a nitrogen atmosphere, said energy being sufficient to sputter at least a portion of said target onto a substrate to form a crystalline β-$C_3N_4$ phase upon said substrate, wherein said substrate comprises an oriented single crystal of silicon, germanium, or other crystalline substrate having appropriate lattice parameters and orientation.

31. A composition of matter according to claim 30 wherein said substrate comprises single crystal silicon.

32. A composition of matter according to claim 31 wherein said single crystal silicon has a surface of (100) orientation.

33. A composition of matter according to claim 31 or 32 wherein said target comprises carbon.

34. A composition of matter according to claim 33 wherein said source of energy comprises energy generated by an RF diode.

35. A composition of matter according to claim 33 wherein said atmosphere consists essentially of nitrogen.

36. A composition of matter according to claim 30 wherein said substrate comprises a single crystalline germanium.

* * * * *